United States Patent [19]

Reitz

[11] 4,126,149
[45] Nov. 21, 1978

[54] SOLAR ENERGY ELECTRICAL CONVERSION APPARATUS

[75] Inventor: Ronald P. Reitz, Annapolis, Md.

[73] Assignee: Tom Swift Enterprises, Inc., Annapolis, Md.

[21] Appl. No.: 805,399

[22] Filed: Jun. 10, 1977

[51] Int. Cl.² ............................................ H01L 31/04
[52] U.S. Cl. .......................... 136/89 AA; 136/89 TF; 313/94; 313/99
[58] Field of Search ..................... 136/89 AA, 89 TF; 313/94, 99

[56] References Cited

U.S. PATENT DOCUMENTS

| 3,058,022 | 10/1962 | Coleman | 313/96 |
| 3,121,648 | 2/1964 | Jensen | 136/89 |
| 3,218,196 | 11/1965 | Jensen et al. | 136/89 |

OTHER PUBLICATIONS

A. S. Jensen et al., "Photoelectric Conversion", Proc. 14th Power Sources Conf., May 1960, pp. 46–49.

*Primary Examiner*—John H. Mack
*Assistant Examiner*—Aaron Weisstuch
*Attorney, Agent, or Firm*—Bacon & Thomas

[57] ABSTRACT

An apparatus is described for directly converting solar energy into electrical energy for utilization in driving any desired load. The apparatus comprises an electron emitting means, a collecting means, a first electrode means positioned proximate the emitting means and spaced therefrom and positioned on the opposite side of the emitting means from the collecting means, a second electrode means positioned proximate the collecting means and spaced therefrom and positioned on one side of the collecting means away from the emitting means, control means for selectively charging and discharging the first and second electrode means, and means for electrically connecting the emitting means and collecting means in circuit with the load to be driven.

21 Claims, 4 Drawing Figures

SOLAR ENERGY ELECTRICAL CONVERSION APPARATUS

BACKGROUND OF THE INVENTION

1. Field of the Invention

The invention is in the field of solar energy conversion apparatus for converting solar energy directly into electrical energy.

2. Description of the Prior Art

Prior art solar energy conversion systems utilized to directly produce electrical energy employ semiconductor material which, upon exposure to solar radiation produces electron-hole pairs and a corresponding electric current when a potential is applied across the semiconductor surfaces. Examples of such prior art devices are taught in U.S. Pat. Nos. 2,736,848, 2,981,777 and 2,949,498. Alternate prior art devices employ photoemissive surfaces which, upon exposure to incident solar radiation liberate electrons by means of the photoelectric effect. Typically, the liberated electrons are collected through a vacuum space on a collecting surface and the potential produced between the emitting and collecting surfaces form a voltage source which may be utilized for driving a load. Examples of such teachings are shown in U.S. Pat. Nos. 3,121,648 and 3,218,196. A similar technique utilizes thermally liberated electrons from an emitting surface upon exposure to incident solar radiation. The thermally liberated electrons are collected on a collecting plate and utilizes to drive a load. U.S. Pat. No. 3,026,439 is an example of such a thermal energy converter.

The prime disadvantage of the prior art direct conversion systems is in their low efficiency and high cost. Typically, such devices may find application in various trigger circuits such as door openers, alarm detectors and the like but do not find broad application as prime energy sources per se.

SUMMARY OF THE INVENTION

It is an object of the invention to provide a solar energy conversion apparatus for producing electrical energy which overcomes the disadvantages of the prior art.

Another object of the invention is to provide a high efficiency solar converting apparatus for producing electrical energy.

Yet another object of the invention is to provide a method and apparatus wherein photoelectrons are liberated from an electric emissive surface and collected in a capacitive-type storage apparatus for generating a relatively large amount of electric charge to be utilized in powering a load.

The apparatus according to the invention produces electrical energy from electromagnetic radiation and comprises a means for emitting electrons in response to the electromagnetic radiation, a means for collecting the electrons, the collecting means positioned proximate the emitting means and spaced therefrom, first and second electrode means positioned outside of said emitting means and collecting means respectively so as to sandwich said emitting means and collecting means therebetween, control means for selectively charging and discharging said first and second electrode means, and means for electrically connecting and disconnecting the emitting and collecting means in circuit with a load which is desired to be driven.

BRIEF DESCRIPTION OF THE DRAWINGS

These and other objects of the invention will become clear in relation to the following description when taken in conjunction with the drawings wherein.

DETAILED DESCRIPTION OF THE PREFERRED EMBODIMENTS

Figure 1:
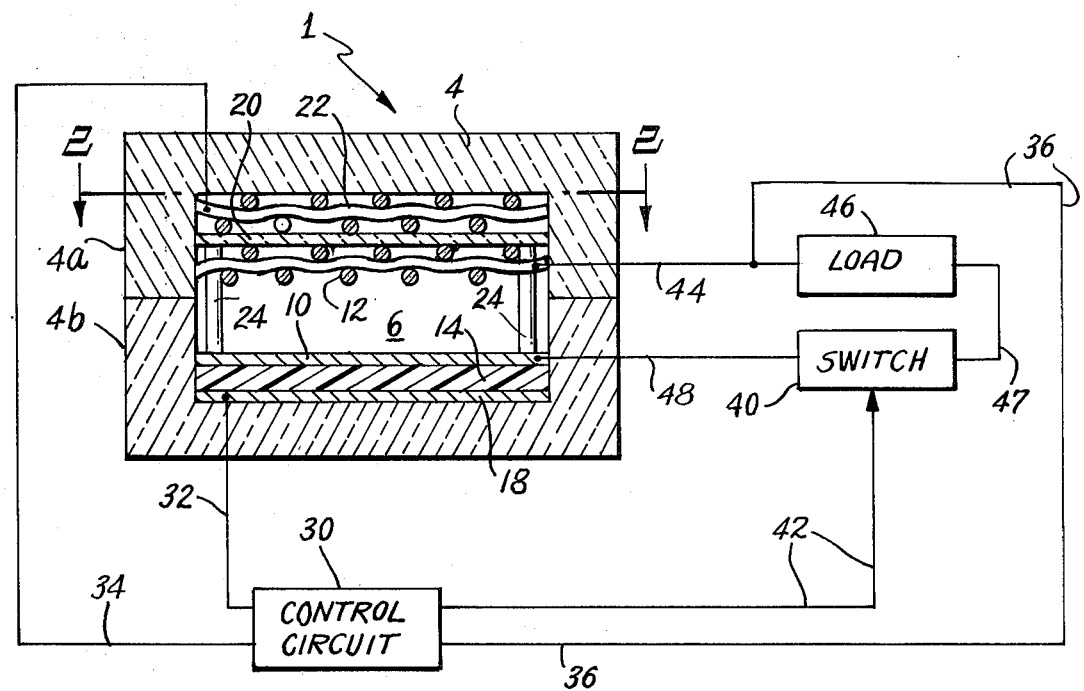
FIG. 1 is a sectional view of the energy conversion apparatus in accordance with the invention showing the electronic control circuits in block diagrammatic form.

As shown in FIG. 1, the energy conversion apparatus 1 comprises a housing 4 within which are contained the photoemissive surfaces and collecting grids in accordance with the invention. The housing may comprise an upper portion 4a and a lower portion 4b hermetically sealed together and defining a vacuum or low pressure chamber 6 within the housing 4. The housing 4 may comprise for example a glass plate such as Corning 7740 having high light transmission characteristics. Within the housing 4 there is contained an electron emitting surface 10 and an electron collecting surface 12. The emitting surface and collecting surface are spaced apart within the vacuum chamber 6. Typically, the electron emitting surface may comprise an alkali-metal such as sodium which may be vacuum deposited in relatively pure form upon a substrate 14. The substrate 14 is also utilized as a dielectric means to separate the emitting surface 10 from a first outer electrode 18. Alternately, of course, the electron emitting surface 10 may be deposited upon a separate substrate positioned between the substrate 14 and the emitting surface 10.

Figure 2:
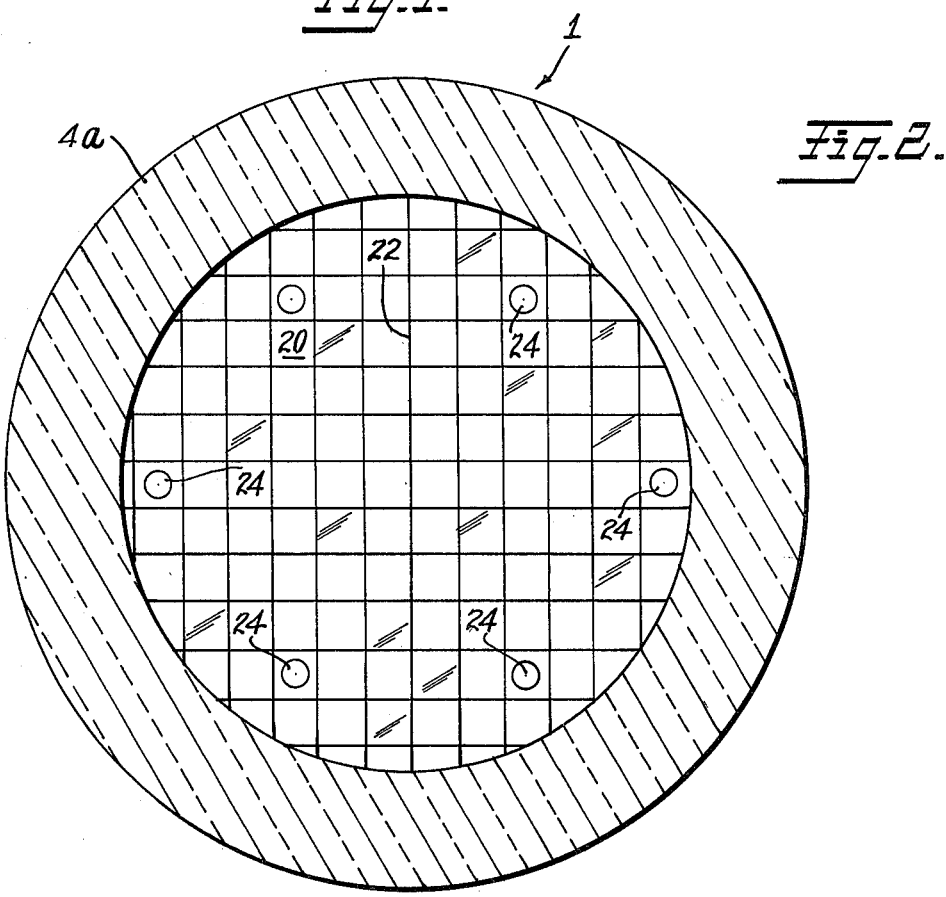
FIG. 2 is a plan view of the conversion apparatus in accordance with the invention taken along line 2—2 of FIG. 1.

The electron collecting surface 12 is shown to be in the form of a thin wire, grid surface (enlarged in the drawing for clarity) and may comprise, for example, stainless steel, silver, copper, iron or other conducting surfaces. The collecting surface 12 may be secured against a second substrate 20 which may comprise, for example, glass or other material of high light transmission characteristics. It is also apparent that the electron collecting surface 12 may be in the form of transparent conductive strips which are positioned directly on the second substrate 20 or upon a separate, transparent substrate positioned between the collecting surface 12 and the second substrate 20. A second outer electrode 22 is also shown above the surface of second substrate 20 on the side opposite the collecting surface 12. The second outer electrode 22 is also in the form of a grid similar to the grid forming the electron collecting surface 12. The second outer electrode grid structure is better illustrated in FIG. 2. Typically, it is desired to form an electrode surface which is transparent to incident electromagnetic solar radiation. As such, the grid structures which form the collecting surface 12 and the second electrode 22 are made from relatively thin wire mesh so that the grid structures intercept only a small amount of incident solar radiation. Any materials positioned between the second electrode 22 and the collecting surface 12 are fabricated from materials which are highly transparent to solar radiation such as, for example, the glass of the type described above in relation to the housing 4. Spacing means 24, made, for example, of glass, are positioned between emitting surface 10 and collecting surface 12 to keep them apart. For the grid structure of the collecting surface 12 shown in FIG. 1, the spacing means extends through a grid opening and abuts against second substrate 20.

Also shown in FIG. 1 is a control circuit 30 having one line 32 connected to the first outer electrode plate 18 through the housing 4 and a second line 34 connected to the second outer electrode 22 through the housing 4. The control circuit 30 functions to controllably charge and discharge the first and second outer electrodes. A control circuit sensing line 36 is also illustrated connecting the control circuit 30 to the collecting surface 12 via a line 44. A switching circuit 40 is connected to the control circuit 30 by means of a conductor 42. The switching circuit has one lead 48 connected to the electron emitting surface 10 and a second lead 47 connected to a load representative generally by member 46. Load 46 is then connected to electron collecting surface 12 to complete the circuit by means of conductor 44.

Figure 4:
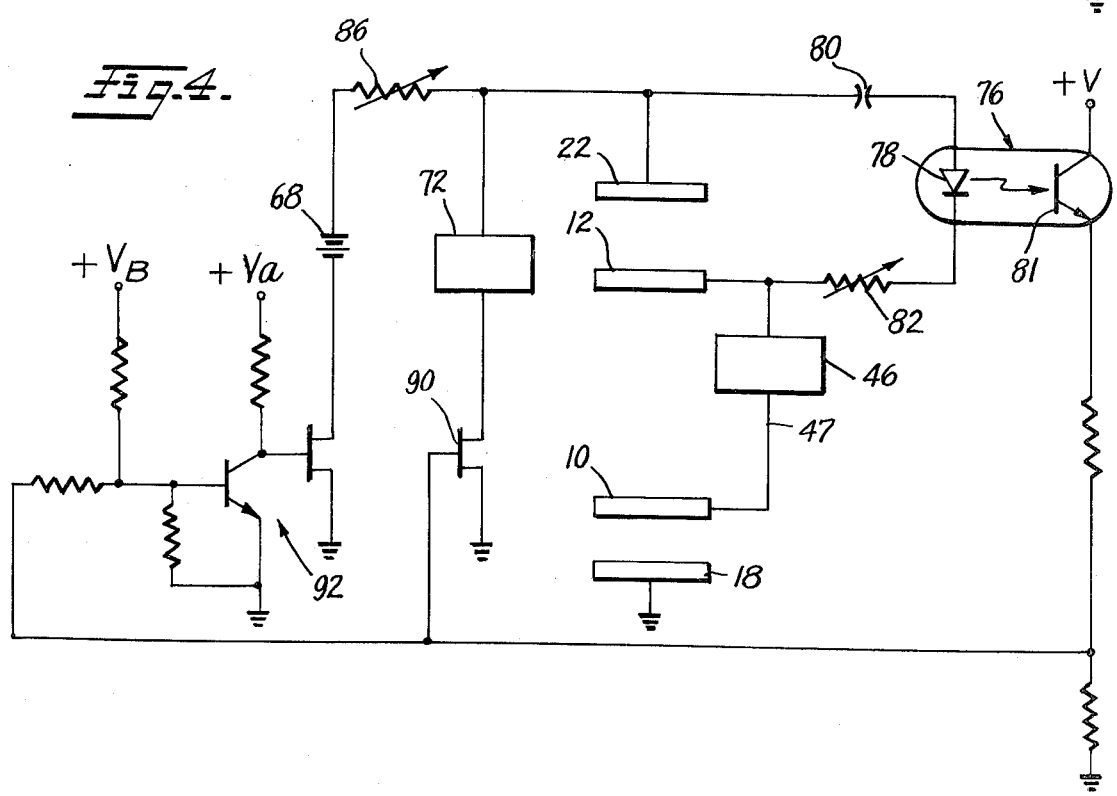
FIG. 4 is an alternate embodiment of the electrical circuit utilized in the conversion apparatus of FIG. 1.

In another embodiment of the invention, illustrated in detail in FIG. 4, the switching circuit 40 may be omitted (as well as line 42) and the load connected directly between the leads 44 and 48, i.e. connected directly between the collecting and emitting surfaces.

The load 46 may, for example, be any load which is desired to be driven. Typically a plurality of the energy converters 1 may be utilized in series or in parallel to drive a given load.

In operation, the housing 4 is positioned to receive incident solar radiation which passes through upper portion 4a of housing 4, second outer electrode 22, second substrate 20, electron collecting surface 12 and impinges upon the electron emitting surface 10. The electron emitting surface 10, for example composed of sodium, produces electrons by means of the photoelectric effect in response to the incident solar radiation. The electron emitting surface should have a relatively low work function and a high quantum mechanical efficiency for conversion of the solar energy to a relatively large amount of electron kinetic energy. The electrons emitted from the emitting surface 10 due to the photoelectric effect are collected on the collecting surface 12. These electrons are collected primarily because of the kinetic energy imparted to the electrons as opposed to electrostatic attraction by the electrons toward the second outer grid 22. Thus, even though the control circuit 30 is effective to controllably charge the first and second outer electrodes with an equal and opposite charge, the electrostatic field generated thereby is substantially canceled within the region between the emitting and collecting surfaces by the charges collected on these surfaces themselves. In fact, it is generally desirable to maintain the charge on the second outer electrode 22 to be approximately equal to but opposite in sign from the charge on the electron collecting surface 12. Consequently, a positive charge is placed on the second outer electrode 22 to counterbalance the negative charge on the collecting surface 12 which results from the electrons collecting thereon. Similarly, when electrons leave the electron emitting surface 10, a net positive charge is developed thereon. It is desirable to balance this positive charge by an opposite negative charge placed on the first outer electrode 18. The balancing of the charges between the pairs of second outer electrode 22 and collecting surface 12 and the first outer electrode 18 and emitting surface 10 has two advantages. Firstly, electrons which are emitted from the emitting surface 10 experience very little force due to the electrostatic fields inasmuch as the force fields effectively balance out within the vacuum chamber 6 between the emitting surface 10 and collecting surface 12. In this manner an electron from emitting surface 10 will travel to the collecting surface 12 primarily due to its own kinetic energy which results from the photoelectric conversion of the incident radiation. In this manner the apparatus is designed to take maximum advantage of the liberated kinetic energy imparted to the electrons by requiring that the potential developed between emitting surface 10 and collecting surface 12 be primarily the result of the electron kinetic energy and not from any outside external electrical forces.

A second reason for increasing the charge on the first and second outer electrodes to compensate for the charge developing on the emitting and collecting surfaces is to minimize space charge effects which would otherwise tend to repel photoelectrons from the collecting surface 12. Inasmuch as the electrons experience very little electrostatic field within the vacuum chamber 6 their kinetic energy is sufficient to allow them to reach the collecting surface 12 upon which time they are retained thereon by an ever increasing charge placed on the outer electrode 22. Simultaneous therewith the increasing positive charge developed on the emitting surface 10 is counterbalanced by an increasing negative charge placed on the first outer electrode 18.

The amount of charge collected on the collecting surface 12 is limited only by the breakdown potential of the first substrate 14 and second substrate 20. A very large charge may exist on the respective surfaces 10 and 12 which consequently will produce a very large voltage difference when these two surfaces are placed in an electric circuit. In order to utilize the potential developed across surfaces 10 and 12, the charge on the first outer electrode 18 and second outer electrode 22 is first dissipated so that the charge on the emitting and collecting surfaces are no longer retained thereon and may be utilized to drive a load.

To this end, control circuit 30 is connected to the first outer electrode 18 and second outer electrode 22 to dissipate the charge at a controlled time or at a controlled voltage as may be desired. The dissipation of the charge is ultimately achieved by passing the charge through an electrical storage unit such as a battery so that this charge may be utilized at a later time. While the electrostatic charge on the outer electrodes is being dissipated through the circuit which comprises the outer electrodes, lead 32, control circuit 30 and lead 34, the voltage difference between the emitting surface 10 and collecting surface 12 may be utilized to drive an external load 46. Load 46 may be driven through a switching means 40 which is controlled by the control circuit 30 via conducting line 42. Switching means 40 will effectively connect the emitting and collecting surfaces to the load 46 while the charge is being dissipated on the outer electrodes 18 and 22. The switching means may operate with the control circuit 30 to connect the emitting means and collecting means in circuit after charge dissipation has stopped on the outer electrodes but before recharging of these outer electrodes begins during a subsequent cycle of operation. Consequently, load 46 is connected in circuit when the outer electrodes are not being charged by the control circuit 30. In some cases, it may be desirable to utilize the load circuit during the dissipation of the charge on the outer electrodes while in other cases it might be desirable to wait for complete or a substantially complete discharge to occur before the load circuit is connected. In this regard it is not necessary to completely discharge the first and second outer electrodes, but rather the charge thereon may be dissipated to a relatively low, but finite, value.

In effect, the emitting and collecting surfaces act as a capacitor and the entire energy conversion apparatus 1 is an effective capacitive storage unit which provides pulse energy to a load. Once the charge on the emitting and collecting surfaces 10 and 12 has been utilized in the load circuit, the charge on the outer electrodes can then be slowly increased to repeat the cycle so that further charges produced by the emitted electrons from the emitting surface 10 are again neutralized. That is, when subsequent electrons leave the emitting surface 10 and consequently produce a positive charge thereon, these positive charges are again held in place through the substrate 14 (dielectric glass) by means of an equal negative charge placed on first outer electrode 18. Likewise, the subsequent electrons collected on the collecting means 12 provides an overall negative charge thereon which is compensated for through the second substrate 20 by means of an equal but opposite positive charge placed on the second outer electrode 22. The cycle is repetitive. The switching means 40 is operable in timed relation (synchronism) with the control circuit 30. The discharging of the outer electrodes, may, for example, take place substantially simultaneously with the discharging of the charge between the emitting and collecting surfaces 10 and 12 through the load 46. Increasing of the charge between the emitting and collecting surfaces 10 and 12 takes place together with increasing of the charge on the outer electrodes 18 and 22. The pulse rate as dictated by the control circuit 30 may be keyed to simple time consideration and/or voltage considerations. Typically, one may utilize a battery in control circuit 30 to automatically provide the appropriate charge on the outer electrodes 18 and 22 as the effective dielectric constant changes within the region between electrodes 18 and 22. The effective dielectric constant between outer electrodes 18 and 22 will change as charge is accumulated between the emitting surface 10 and collecting surface 12 in response to incident solar radiation. The battery applies its constant potential to the open circuit across outer electrodes 18 and 22. In this manner the charge from the battery will substantially follow the build up of charge resulting from the emission of photoelectrons. The discharge of outer electrodes 18 and 22 may be done at any given time by reconnecting the battery within the control circuit 30 such that charge is passed in a circuit from the first outer electrode 18 to the second outer electrode 22. Initiation of the discharge between the outer electrodes may be dependent upon a certain voltage potential between, for example, the outer electrode 22 and the collecting surface 12. Alternately, the discharge between the outer electrodes may take place at a certain time such as that dictated by an oscillator whose frequency may be adjusted, and for example may be adjusted in accordance with the intensity of solar energy passing through the upper housing portion 4a.

Figure 3:
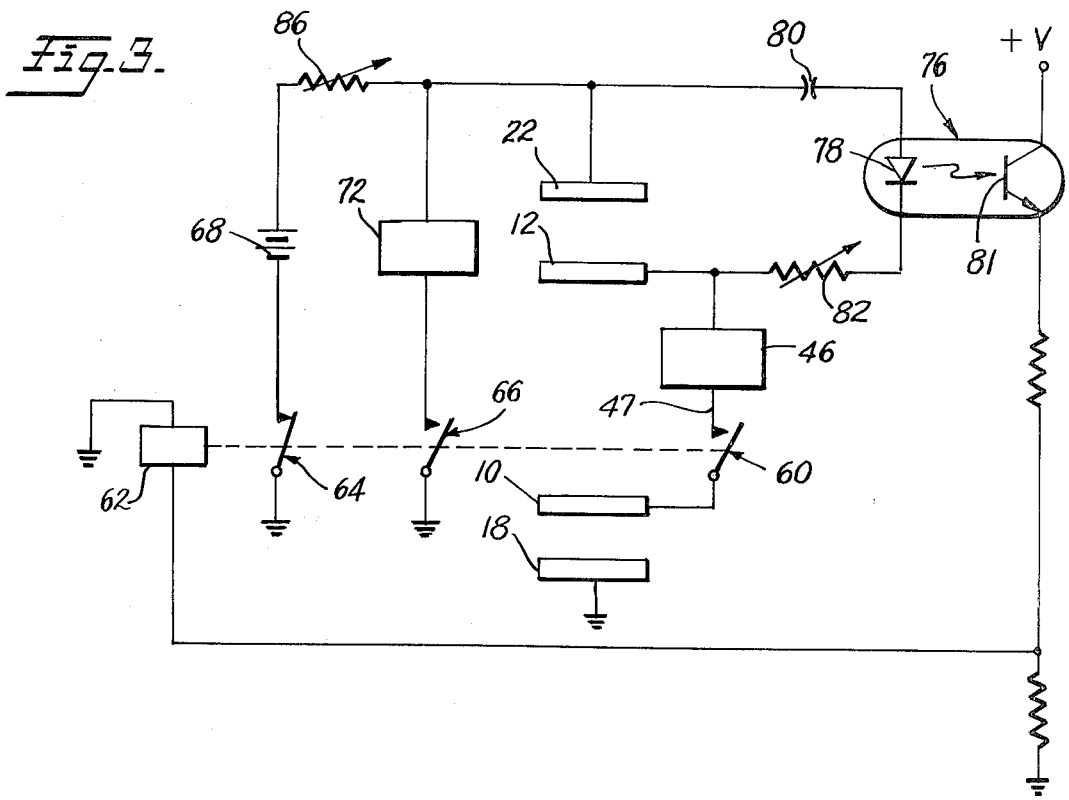
FIG. 3 is a schematic diagram of the electrical circuit utilized in the conversion apparatus of FIG. 1.

FIG. 3 shows a detailed schematic diagram of the control circuit 30, switching circuit 40 and their interconnection to the energy conversion apparatus 1.

The major portions of the energy conversion apparatus 1 are shown in FIG. 3, namely, emitting surface 10, collecting surface 12 and first and second outer electrodes 18 and 22 respectively. Switching circuit 40 is shown as a simple switch 60 operable in response to a relay coil 62 which also, and simultaneously, operates additional switches 64 and 66. Switch 64 is used to connect and disconnect a power source 68 used to supply charge to first and second outer electrodes 18 and 22. Power source 68 may be a simple battery as shown or a rectified output from an AC source. Switch 66 is used to connect and disconnect a storage battery 72 which stores the energy discharged from the outer electrodes. Typically, the storage battery has its negative pole connected to the outer electrode 22.

Activation of relay coil 62 is achieved by means of a sensing means in the form of an optical coupler 76 which has a photodiode 78 connected in circuit with a spark gap 80 and a variable resistor 82. The spark gap is connected to the outer electrode 22 and the variable resistor 82 is connected to the collecting surface 12. When the voltage potential across the collecting surface 12/outer electrode 22 is sufficiently high, a current will momentarily conduct through the spark gap 80 and photodiode 78. A photosensitive transistor 81 of optical coupler 76 is then momentarily energized to activate the relay coil 62 and open switch 64 while closing switches 66 and 60. As a result, the charge which was accumulating on outer electrodes 18 and 22 is now discharged via switch 66 into storage battery 72. The dissipation of the charge on the outer electrodes 18 and 22 enables the charge accumulated on collecting surface 12 to feed through load 46 and via closed switch 60 to emitting surface 10. When the relay coil is deactivated, the switches 60, 64 and 66 revert back to their positions shown in FIG. 3 and the charging cycle begins. Preferably, the outer electrodes 18 and 22 are charged to approximately match the charge produced by the electrons accumulating on collecting surface 12 as a result of the photoelectric effect. A variable resistor 86 may be used to control the rate of charging the outer electrodes 18 and 22.

The circuit of FIG. 3 utilizing relay coils and switch contacts may obviously be replaced by alternate switching means. Additionally, as indicated above, it is possible to omit entirely switch 60 and to have load 46 continually connected across emitting surface 10 and collecting surface 12. Current through the load circuit will only be appreciable when the charge on the outer electrodes 18 and 22 is smaller than the charge built up on the collecting surface. Consequently, retaining a nearly equal charge on outer electrodes 18 and 22 as appears on collecting surface 12 has the effect of prohibiting current flow in the load circuit. Simultaneously with or after the outer electrode is discharged (via storage battery 72) the load current may flow. Switch 60, however, provides added positive control of load current flow, and may be used, additionally, with separate control means to selectively time the connection of the load circuit in relation to any desired time during the discharge of outer electrodes 18 and 22.

FIG. 4 is another embodiment of the invention showing the load 46 connected directly across the emitting surface 10 and collecting surface 12. Additionally, FIG. 4 illustrates alternate switching means such as FET 90 and transistor/FET combination 92. Other switching means will be apparent to those of skill in the art.

It is understood that the sensitivity of the conversion apparatus to the electromagnetic solar spectrum depends largely upon the choice of materials selected for the emitting surface 10.

It is also contemplated that thermal energy resulting from the incident electromagnetic radiation will be effective to liberate additional electrons by means of thermionic emission. These electrons may likewise be utilized similar to the utilization of the photoelectrons as discussed above. The terminology "means for emitting electrons" as used in the claims is intended to include photoelectric and thermionic emission and equivalents thereof.

It is clear that there need not be an exact cancellation of the electrostatic field within the vacuum chamber 6 of the housing 4. Thus, if the charge on the outer electrodes does not exactly compensate the charge on the emitting and collecting surfaces there will result an electrostatic field within the vacuum chamber 6. It is desirable that this field be maintained quite low but it is not absolutely necessary that the field be zero. If the field is non-zero it is desirable that the field exist in a direction from the collecting surface to the emitting surface for a conventional positive test charge. With respect to photoelectrons emitted from the emitting surface 10, the net electrostatic field would tend to attract them toward the collecting surface 12. However, the net electrostatic field within the vacuum region 6 need not be very strong and in fact it is most desirable to allow the kinetic energy of the electrons to play the major role in transporting the electrons from the emitting surface 10 to the collecting surface 12 without the utilization of external energy in the form of external electrostatic fields.

I claim:

1. Apparatus for producing electrical energy from electromagnetic radiation comprising:
   (a) means for emitting electrons in response to said electromagnetic radiation,
   (b) means for collecting said electrons, said collecting means positioned proximate to and on one side of said emitting means and spaced therefrom,
   (c) a first electrode means positioned proximate said emitting means, said first electrode means positioned on the other side of said emitting means,
   (d) said first electrode means spaced from said emitting means whereby a first dielectric region is established therebetween,
   (e) second electrode means positioned proximate said collecting means, said second electrode means positioned on a side of said collecting means away from said emitting means,
   (f) said second electrode means spaced from said collecting means whereby a second dielectric region is established therebetween,
   (g) means for securing said emitting means, collecting means, first electrode means and second electrode means together as a unit, said securing means permitting entry of electromagnetic radiation onto said electron emitting means, and providing at least a partial vacuum between said emitting means and said collecting means,
   (h) means for controllably charging and discharging said first and second electrode means, and
   (i) means for electrically connecting said emitting means and said collecting means in circuit with a load which is desired to be driven.

2. An apparatus as defined in claim 1 further comprising means for operating said load circuit when said control means is discharging.

3. An apparatus as defined in claim 1 further comprising means for operating said load circuit after said control means has substantially discharged said first and second electrodes and prior to recharging said electrodes.

4. An apparatus as defined in claim 1 wherein said emitting means comprises a low work function material.

5. An apparatus as defined in claim 4 wherein said material is sodium.

6. An apparatus as defined in claim 1 wherein said control means comprises:
   (a) means for providing a DC voltage for charging, said first and second electrode means with opposite charges,
   (b) means for sensing the voltage between any two oppositely charged members of the group: first electrode means, second electrode means, emitting means and collecting means, and
   (c) means for initiating discharging of said first and second electrode means in response to said sensing means.

7. An apparatus as defined in claim 6 wherein said control means further comprises switching means in said load circuit for electrically connecting and disconnecting said load to said emitting means and collecting means.

8. An apparatus as defined in claim 7 wherein said control means further comprises means for activating said switching means in response to said sensing means.

9. An apparatus as defined in claim 8 wherein said two oppositely charged members of the group are said collecting means and said second electrode means.

10. An apparatus as defined in claim 1 wherein said first dielectric region comprises a glass material.

11. An apparatus as defined in claim 1 wherein said second dielectric region comprises a glass material.

12. An apparatus as defined in claim 1 wherein said second dielectric region is transparent to at least a portion of the solar radiation spectrum.

13. An apparatus as defined in claim 1 wherein said securing means comprises housing means for housing said emitting means, collecting means, first and second electrode means and said first and second dielectric region, said housing means substantially air tight to permit at least a partial vacuum therein.

14. An apparatus as defined in claim 13 wherein said housing means has a transparent surface adjacent said second electrode means.

15. An apparatus as defined in claim 14 wherein said second electrode means and said collecting means permit a substantial portion of solar radiation incident thereon to pass therethrough to impinge onto said emitting means.

16. An apparatus as defined in claim 15 wherein said second electrode means and said collecting means are each in the form of a grid-like structure.

17. An apparatus as defined in claim 13 further comprising a first member of non-conducting material positioned within said first dielectric region and a second member of non-conducting material transparent to at least a portion of the solar radiation spectrum positioned within said second dielectric region.

18. An apparatus as defined in claim 17 wherein said second member is made of glass.

19. An apparatus as defined in claim 1 wherein said second electrode means and said collecting means permit a substantial portion of solar radiation incident thereon to pass therethrough to impinge onto said emitting means.

20. An apparatus as defined in claim 19 wherein said second electrode means and said collecting means are each in the form of a grid-like structure.

21. Apparatus for producing electrical energy from electromagnetic radiation comprising:
 (a) means for emitting electrons in response to said electromagnetic radiation,
 (b) means for collecting said selectrons, said collecting means positioned proximate to and on one side of said emitting means and spaced therefrom,
 (c) a first electrode means positioned proximate said emitting means, said first electrode means positioned on the other side of said emitting means and spaced therefrom whereby a first dielectric region is established between said emitting means and first electrode means,
 (d) second electrode means positioned proximate said collecting means, said second electrode means positioned on a side of said collecting means away from said emitting means, and spaced therefrom whereby a second dielectric region is established between said collecting means and said second electrode means,
 (e) control means for selectively charging and discharging said first and second electrode means,
 (f) switching means for electrically connecting and disconnecting said emitting means and said collecting means in circuit with a load which is desired to be driven,
 (g) said switching means operable in response to said control means for connecting said circuit when said control means is not charging said first and second electrodes and operable for disconnecting said circuit when said control means is charging said electrodes, and
 (h) means for securing said emitting means, collecting means and first and second electrode means to a housing, said housing being substantially air tight to permit at least a partial vacuum between said emitting means and said collecting means.

* * * * *